(12) United States Patent
Ware et al.

(10) Patent No.: US 10,177,749 B2
(45) Date of Patent: Jan. 8, 2019

(54) DIFFERENTIAL CRYOGENIC TRANSMITTER

(71) Applicant: Rambus Inc., Sunnyvale, CA (US)

(72) Inventors: Frederick A. Ware, Los Altos Hills, CA (US); John Eric Linstadt, Palo Alto, CA (US); Carl W. Werner, Los Gatos, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 15/478,757

(22) Filed: Apr. 4, 2017

(65) Prior Publication Data

US 2017/0324019 A1 Nov. 9, 2017

Related U.S. Application Data

(60) Provisional application No. 62/331,774, filed on May 4, 2016.

(51) Int. Cl.
| | | |
|---|---|---|
| H03K 5/22 | (2006.01) | |
| H04L 25/02 | (2006.01) | |
| H03K 3/38 | (2006.01) | |
| H03K 19/0175 | (2006.01) | |
| H03K 19/195 | (2006.01) | |

(52) U.S. Cl.
CPC ....... H03K 3/38 (2013.01); H03K 19/017509 (2013.01); H03K 19/195 (2013.01)

(58) Field of Classification Search
CPC .................................................. H01L 39/025
See application file for complete search history.

(56) References Cited

U.S. PATENT DOCUMENTS

| | | | |
|---|---|---|---|
| 5,099,152 A | 3/1992 | Suzuki et al. | |
| 5,295,093 A * | 3/1994 | Nagasawa | G11C 11/44 |
| | | | 326/1 |
| 5,661,373 A | 8/1997 | Nishizawa | |
| 6,288,581 B1 * | 9/2001 | Wong | H03K 5/2481 |
| | | | 327/108 |

(Continued)

OTHER PUBLICATIONS

H. Suzuki et al "A Josephson Driver to Interface Josephson Junctions to Semiconductor Transistors" Technical Digest., International Electron Devices Meeting, San Francisco, CA, USA, 1988, pp. 290-293.

(Continued)

*Primary Examiner* — Kenneth B Wells
(74) *Attorney, Agent, or Firm* — Charles Shemwell

(57) ABSTRACT

In an integrated-circuit component having a signal transmitter receives a transmitter power supply that cycles periodically between power-off and power-on voltage levels to define a sequence of enable intervals during which the signal transmitter is to output voltage levels corresponding to respective transmit data bits onto an external signaling link. The signal transmitter generates, at the start of each output-enable interval, an initial nonzero voltage having a first polarity across conductors of the external signaling link, and then conditionally transitions the initial nonzero voltage to a second nonzero voltage according to whether the transmit data bit corresponding to the output-enable interval has a predetermined one of two binary states, the second nonzero voltage having a polarity opposite the first polarity.

21 Claims, 6 Drawing Sheets

(56) References Cited

U.S. PATENT DOCUMENTS

| | | |
|---|---|---|
| 6,486,756 B2 | 11/2002 | Tarutani et al. |
| 6,580,310 B2 | 6/2003 | Herr |
| 6,917,216 B2 | 7/2005 | Herr |
| 7,724,083 B2 | 5/2010 | Herring et al. |
| 8,837,947 B2 | 9/2014 | Gabory |
| 2004/0201099 A1 | 10/2004 | Herr |
| 2009/0195699 A1 | 8/2009 | Hamada et al. |
| 2010/0177841 A1 | 7/2010 | Yoon et al. |
| 2015/0188506 A1 | 7/2015 | Maiuzzo et al. |
| 2016/0056837 A1 | 2/2016 | Allen |

OTHER PUBLICATIONS

M. Suzuki et al "An Interface Circuit for a Josephson—CMOS Hybrid Digital System" IEEE Transactions on Applied Superconductivity, vol. 9, No. 2, Jun. 1999 pp. 3314-3317.

Manheimer, Marc, "Cryogenic Computing Complexity (C3)", Office of the Director of National Intelligence, Intelligence Advanced Research Projects Activity (IARPA), ASC 2014, Aug. 2014, pp. 1-20. 20 pages.

R. Koch et al, "A NRZ-output amplifier for RSFQ circuits," in IEEE Transactions on Applied Superconductivity, vol. 9, No. 2, pp. 3549-3552, Jun. 1999.

Reilly, David, "Towards Control of a Large-Scale Quantum Computer", 15th Annual Microsoft Research Faculty Summit 2014. 31 pages.

\* cited by examiner

DIFFERENTIAL CRYOGENIC TRANSMITTER

TECHNICAL FIELD

The present disclosure relates to high-speed signaling.

DRAWINGS

The various embodiments disclosed herein are illustrated by way of example, and not by way of limitation, in the figures of the accompanying drawings and in which like reference numerals refer to similar elements and in which.

Figure 4:
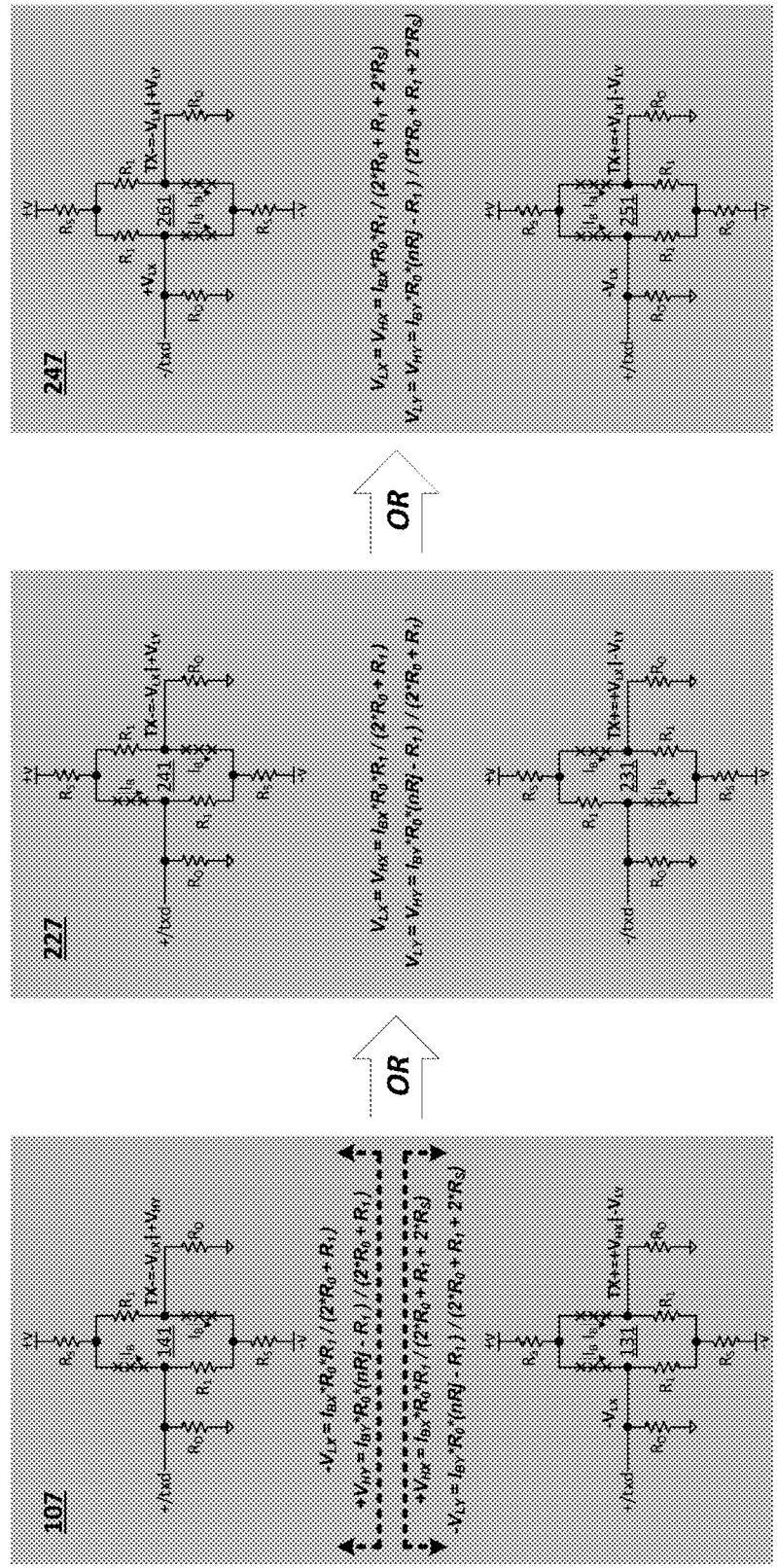
Figure 5:
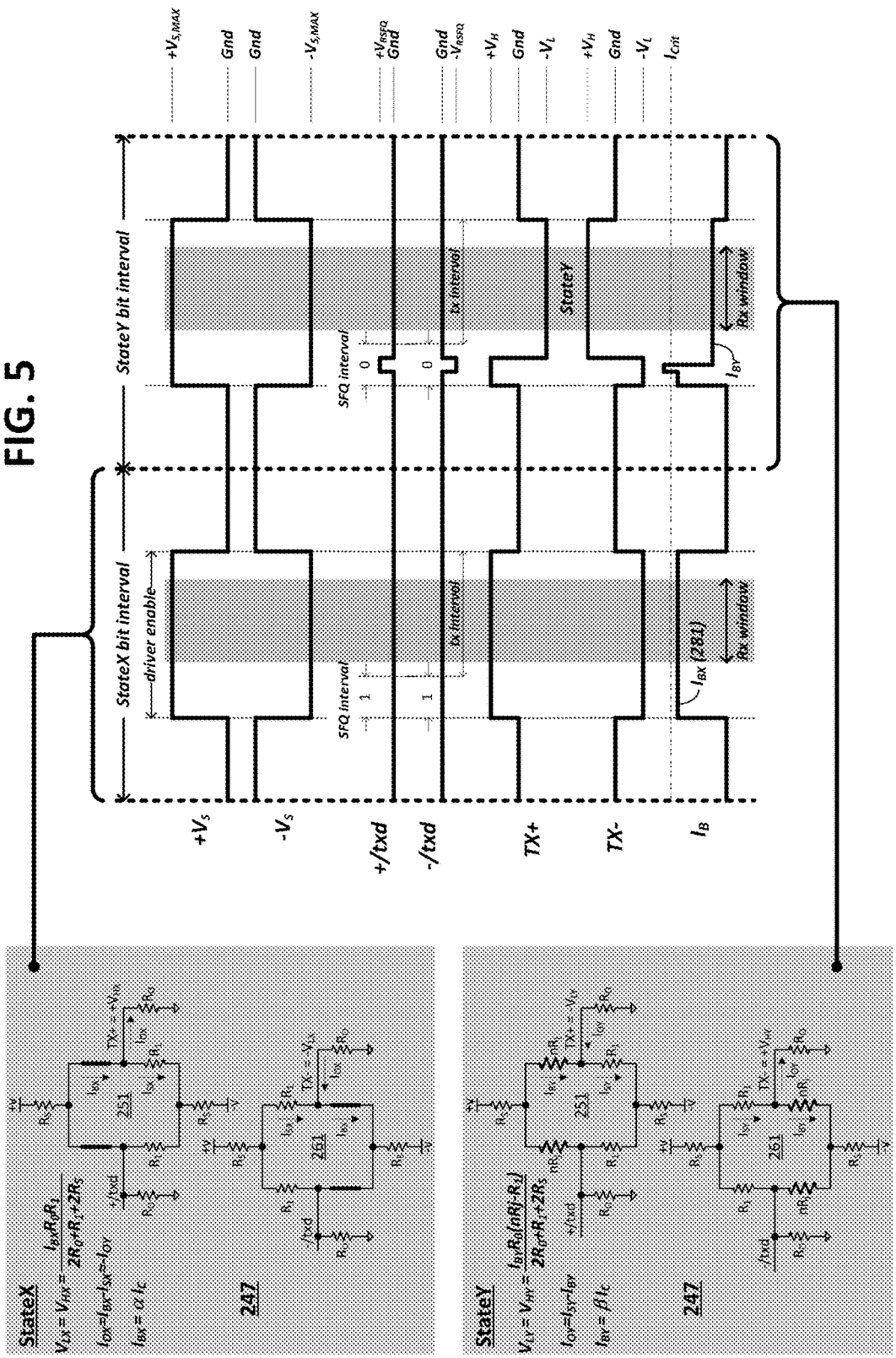
Figure 6:
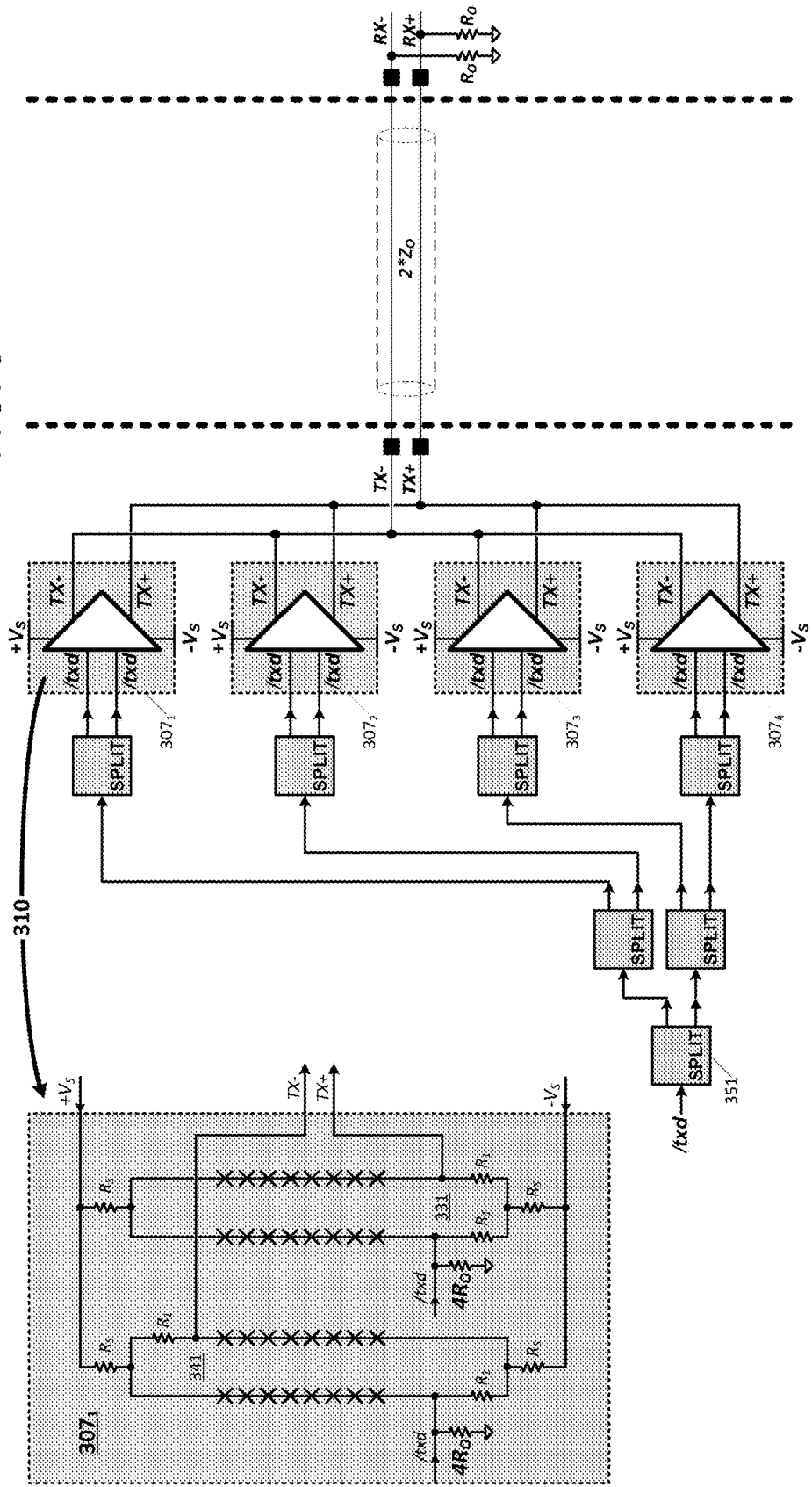
Figure 7:
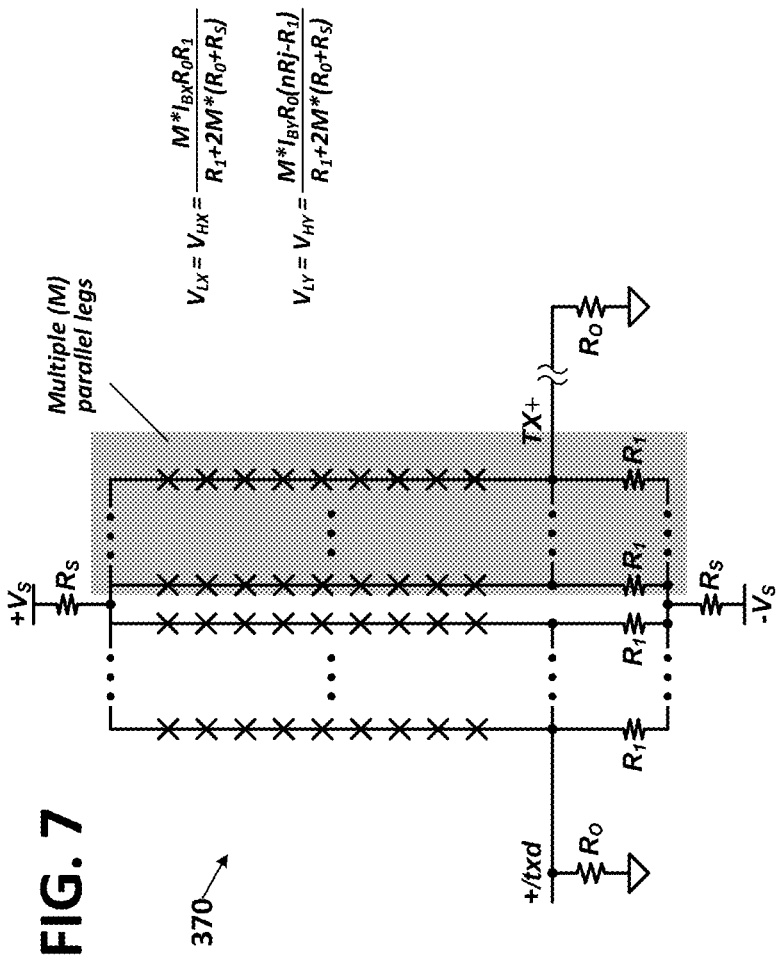

FIG. 4 presents the branch-to-branch output voltages in states X and Y of three alternative output driver implementations (one of which corresponds to the FIG. 1 embodiment) in terms of the bias current flowing through respective input/output legs in each implementation and output state;

FIG. 5 illustrates additional considerations bearing on selection of component values and junction-stack sizes (i.e., number of junctions, 'n', per stack) in the context of an output driver embodiment shown in FIG. 4;

FIG. 6 illustrates a super driver embodiment in which the outputs of four component output drivers are coupled in parallel to drive a differential signaling link; and FIG. 7 illustrates alternative approach to raising the output signal swing, in this case providing multiple parallel input and output legs within each driver branch of a differential output driver.

DETAILED DESCRIPTION

In various embodiments herein, disparately configured resistive networks, each including parallel stacks of Josephson junctions and responsive to respective rapid single-flux quantum (RSFQ) pulse inputs, produce differential output signals that convey digital values with sufficient voltage and timing margin to be received by transistor-based signal receivers. In a number of embodiments, the differential signals are transmitted between integrated circuit (IC) devices disposed in different temperature domains and, more specifically, from (i) a source IC device disposed in a cryogenic temperature domain sufficiently cold to enable superconduction through the Josephson junction stacks to (ii) a destination IC device disposed in a substantially warmer (though possibly still cryogenic) temperature domain (cryogenic temperatures being, for example, temperatures below 93.15 K per U.S. National Institute of Standards and Technology, or, as occasionally defined, temperatures below 123 K). Although the source and destination ICs may implement virtually any core function, in particular embodiments, the source IC implements a memory control function as in the case of a dedicated memory controller component or processor component (e.g., CPU) having a memory control function, while the destination IC implements a data storage function and/or signal buffering function as in the case of a memory component or buffer component, where the latter component serves as an intermediary between the memory control/CPU component and one or more memory components. Although this source/destination terminology is carried forward in detailed embodiments presented below, in all cases, the destination IC may also transmit signals to the source IC, including transmitting signals to the source IC over the same signaling link(s) driven by the source IC (i.e., bidirectionally-driven signaling link(s)), and/or transmitting signals to the source IC via one or more dedicated (uni-directionally-driven) signaling link(s). For example, a source memory-control IC (e.g., CPU or dedicated memory controller) that transmits write data and/or control signals to a destination memory IC may also receive read data signals and/or status information transmitted by the memory IC.

Figure 1:
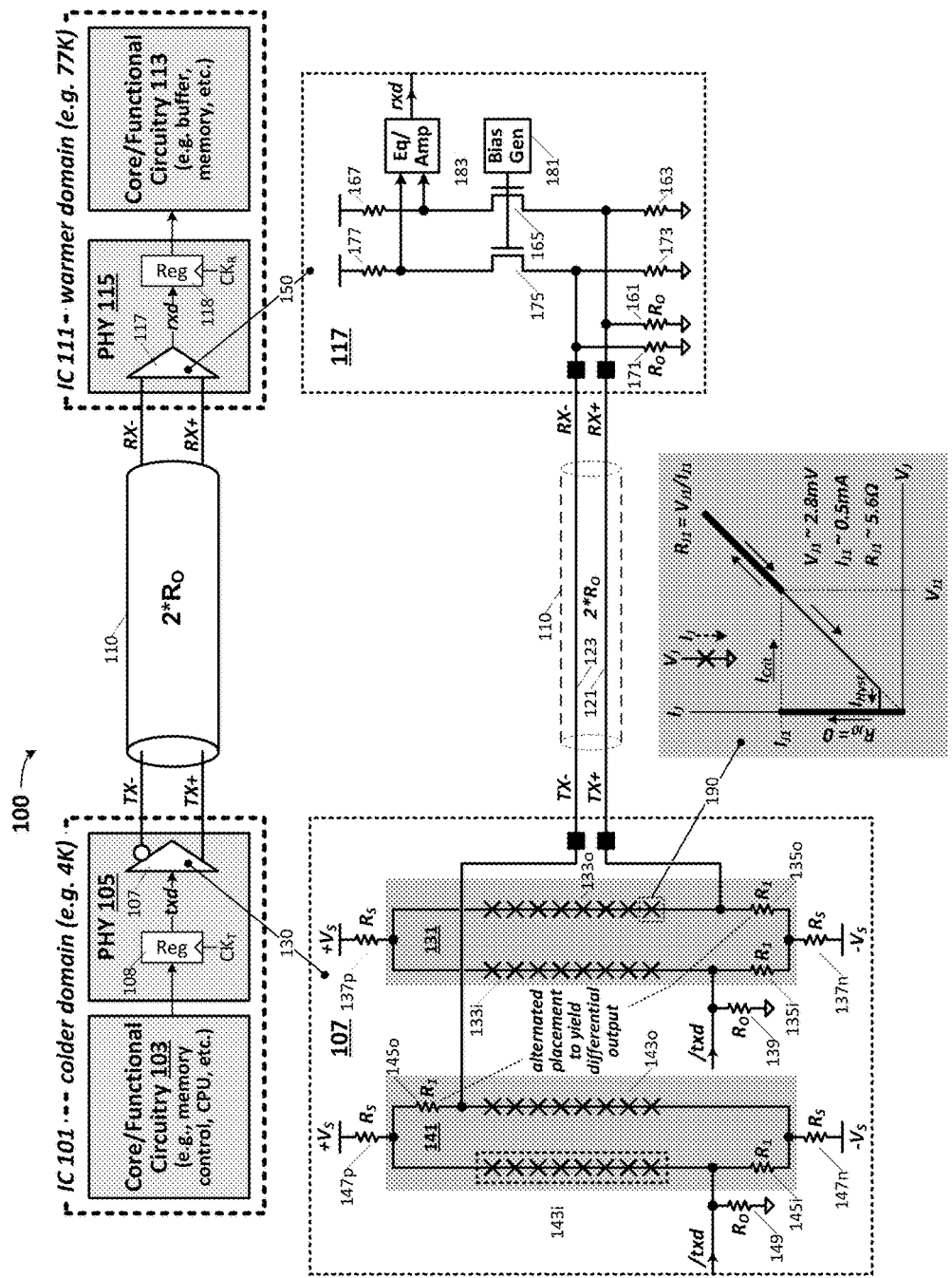
FIG. 1 illustrates an embodiment of a chip-to-chip signaling system in which a multi-conductor signaling link is coupled between IC devices disposed in relatively cold and warm temperature domains.

FIG. 1 illustrates an embodiment of a chip-to-chip signaling system 100 in which multi-conductor signaling link 110 is coupled between IC devices 101 and 111 disposed in relatively cold and warm temperature domains, respectively. More specifically, the cold-domain IC or "cold chip" 101 resides in a cryogenic domain cold enough to permit operation of superconducting circuit components (e.g., 4 Kelvin, though lower or higher temperatures may apply in other embodiments), while the warm-domain IC 111 ("warm chip") resides in a warmer, but still cryogenic, 77 Kelvin environment (again, lower or higher temperatures may apply). As shown, cold chip 101 includes core circuitry 103 (i.e., to implement the core functions of the component, be they memory control, processing, etc.) together with physical signaling circuitry (PHY 105), both of which may be implemented predominantly by extremely low-power RSFQ circuit elements—an implementation that avoids the energy inefficiencies attendant in more conventional transistor-based circuitry. Warm chip 111 also includes core functional circuitry 113 (memory cell array, buffer, etc.) together with a PHY 115, but in a predominantly transistor-based implementation—for example in CMOS (complementary metal oxide semiconductor) circuitry.

While each of the PHYs within ICs 101 and 111 generally includes multiple transmitters and receivers (and/or transceivers) coupled to respective signaling links, PHYs 105 and 115 are depicted for purposes of explanation as minimally containing a synchronous differential transmitter and counterpart synchronous differential receiver, respectively. More specifically, on the transmit side (i.e., within cold chip 101), an RSFQ register element 108 is clocked by a transmit timing signal, $Ck_T$ (e.g., a "transmit clock" though a strobe signals may be employed instead), to deliver a stream of transmit data values to differential output driver 107 during a corresponding sequence of bit-time intervals (also referred to herein as unit intervals or bit intervals). More specifically, in one embodiment, the output of the RSFQ register is either a pulse or absence of a pulse within the corresponding bit interval (i.e., conveying logic '1' and '0' bit values, respectively, or logic '0' and '1' bit values) which, due to the quantum nature of the pulse (i.e., a −2.1 mV-ps pulse—h/2e, a magnetic flux. quantum), is split into two or more identical outputs to drive respective driver branches within differential output driver 107. Output driver 107 responds to the incoming quantum pulse stream by driving, during each bit interval, a differential voltage or pseudo-differential voltage onto the component conductors of signaling link 110 with a voltage swing (difference between more positive and more negative voltage levels) and duration sufficient to enable data bit recovery within transistor-based PHY 115. In the depicted embodiment. receive-side PHY 115 includes a receiver 117 that resolves the transmitted differential signal into a stream of pre-conditioned data signals (rxd) that are latched within sampling element 118 in response to respective transitions of a receive timing signal, $CK_R$. Note that while multi-conductor signaling link 110 is occasionally referred to herein as a differential signaling link, such terminology is intended to encompass conveyance of differential and pseudo-differential signals thereon.

Referring to detail view 130, differential output driver 107 is implemented by disparately configured pair of driver branches 131 and 141, each of which responds to a respective instance of the incoming transmit data value, /txd (i.e., presence or absence of a quantum pulse), by generating a relatively high or relatively low voltage (or vice-versa) at a respective one of transmitter output nodes TX+ and TX−. That is, if the transmit data value (/txd) supplied by register 108 is a logic '1' as signified in complementary form by absence of a quantum pulse for the subject bit interval, driver branch 131 drives a relatively high voltage level at TX+ while driver branch 141 drives a relatively low voltage level at TX−, thus transmitting a logic '1' voltage differential onto the differential signaling link—a transmission line in this case perceived by the transmitter as having an $R_O$ (or $Z_O$) impedance on each conductor. Conversely, if the transmit data value is a logic 0, signified in complementary form by presence of a quantum pulse during the subject bit interval, TX+ output branch 131 drives a relatively low voltage level while TX− output branch drives a relatively high voltage level to transmit a logic '0' voltage differential onto signaling link 110. In either case, the resulting differential data eye (i.e., having an "eye width" duration and "eye height" differential amplitude) propagates across signaling link 110, and arrives at nodes RX+/RX− of differential receiver 117.

In one embodiment, shown in detail view 150, differential receiver 117 terminates the component conductors (121, 123) of signaling link 110 to ground through respective $R_O$ resistive elements (161, 171) and includes component circuits to render the incoming differential signal level to a pre-conditioned rxd output. In the depicted implementation, for instance, differential input nodes RX+ and RX− are coupled to respective legs of a differential amplifier formed by bias-point resistors 163/173 and 167/177, bias transistors 165 and 175, bias generator 181 (i.e., to establish a bias current through each amplifier leg) and equalizer/amplifier circuit 183 which resolves the incoming differential voltage level into a conditioned sample-ready output, rxd. Various other transistor-based receiver circuits may be used to implement differential receiver 117 in alternative embodiments.

Returning to detail view 130 of output driver 107, each of driver branches 131 and 141 is resistively coupled between supply voltage nodes $+V_S$ and $-V_S$ (i.e., coupled to those voltage nodes via respective supply-series resistances $R_S$) and includes a pair of current conduction legs—one "output leg" coupled to a driver output node (i.e., TX+ or TX−, respectively) and one "input leg" coupled to receive the driver input (/txd in this case). Further, each individual input leg and output leg within driver branches 131 and 141 includes, on opposite sides of the driver-branch input or output connection, a series coupled set of Josephson junctions referred to herein as a Josephson-junction stack (i.e., a "junction stack" for brevity) and a drive-point resistor, $R_1$. That is, with regard to driver branch 131, the input leg is formed by a series interconnection of junction stack 133*i* and drive-point resistance 135*i* (with a data input connection (/txd) therebetween and terminated by balance resistor $R_O$), while output leg is implemented by a series connection of drive-point resistance 135*o* and junction stack 133*o* (in this case with a data output connection TX+ coupled between the drive-point resistance and junction stack and coupled to transmission line impedance $R_O$ of conductor 121). Driver branch 141 includes the same component inventory with junction stack 143*i* and drive-point resistance 145*i* in the input leg (terminated by resistance 149) and junction stack 143*o* and drive-point resistance 145*o* in the output leg (with the TX− output node coupled to transmission line impedance $R_O$ of conductor 123). Comparing the output legs of the TX+ and TX− driver branches, however, the orientations of their respective drive-point resistors (135*o*, 145*o*) and junction stacks (133*o*, 143*o*) are relatively transposed (alternated, positionally-switched) with drive-point resistor 135*o* coupled between the TX+ output node and the more negative supply voltage (−Vs) in TX+ driver branch 131, and drive-point resistor 145*o* coupled between the TX− output node and the more positive supply voltage (+Vs) in TX− branch 141. Junction stacks 133*o* and 143*o* are conversely coupled with respect to the drive-point resistances 135*o* and 145*o*, with junction stack 133*o* coupled between TX+ and +Vs and junction stack 143*o* coupled between TX− and −Vs. By this arrangement and by biasing the individual driver-branch input/output legs to enable data-dependent transitioning of the junction stacks from superconducting to resistive (voltage) states—an operation described in greater detail below—the driver branches will generate either of two opposite-polarity differential voltages at the TX+ and TX− output nodes according to incoming transmit data value.

Still referring to FIG. 1 and more particularly to the Josephson junction I-V curve shown in detail view 190, each Josephson junction within a given junction stack behaves hysteretically as current through the junction is increased and then decreased. More specifically, each junction superconducts (i.e., exhibits zero resistance and zero voltage drop) until the conducted current rises above a "critical current" $I_{J1}$ ($I_{Crit}$), at which point the junction transitions from the superconducting state to a "voltage state" characterized by a fixed resistance, $R_{J1}$ (i.e., i.e., such that a nonzero voltage drop appears across the junction). Thereafter, the junction remains in the voltage state even as current drops below the critical current (hence the hysteretic operation), not returning to the superconducting state until the current finally drops below a hysteretic current ($I_{Hyst}$) which may be at or near the zero conduction point. Approximate values for the junction current and voltage at the transition from the superconducting state to the voltage state (and thus the nonzero junction resistance) are shown for an exemplary Josephson junction implementation. Other values may apply in alternative embodiments.

Josephson-junction hysteresis is exploited in the differential output driver 107 of FIG. 1 by biasing the individual driver branches such the current through each input/output leg is marginally below the critical current and choosing the drive-point resistance such that a quantum pulse supplied to the input leg will transiently raise the current within at least one of the input leg or output leg above the critical current, causing one or more of the junctions in that leg to transition to the voltage state and thus increase the net resistance in that leg such that the current in the counterpart leg is increased sufficiently above the critical current to transition all the junctions in that leg (i.e., the entire junction stack) into the voltage state. The transition of the entire junction stack in either the input leg or output leg to the voltage state shifts the predominant current back to the alternate leg (output or input) causing the remaining junctions in that stack to transition to the voltage state. Overall the back-and-forth current imbalance within input and output legs of a given driver branch occurs over a matter of picoseconds, effecting a near instantaneous transition of the entire output driver (i.e., the two stacks of Josephson junctions in each driver branch) from a superconducting-stack state to a resistive-stack state—referred to herein as driver output states X and Y, respectively.

Figure 2:
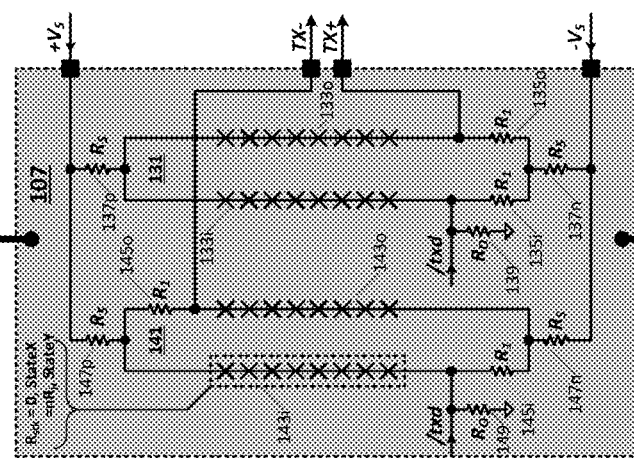
FIG. 2 illustrates an exemplary timing diagram for generation of data-dependent 'X' and 'Y' driver output states in accordance with the differential output driver shown in FIG. 1.

FIG. 2 illustrates an exemplary timing diagram for generation of data-dependent X and Y driver output states in accordance with the differential output driver shown in FIG. 1. In the depicted example, the driver supply voltages +Vs and −Vs are supplied by circuitry outside the cold-chip temperature domain (e.g., supplied by the warm chip or another component in the warmer domain) and cycled between ground and maximum voltage potentials (+Vs,max and −Vs,max) during every bit interval. As the supply voltages are driven to the ground or "reset" potential, the bias current within each leg of each driver branch is zeroed, resetting any voltage-state junction stacks to transparency (i.e., to the superconducting or transparent state) at the conclusion of a given hit interval and start of the subsequent bit interval. Accordingly, when the voltage supply nodes transition from their reset levels (e.g., ground) to maximum supply levels (+Vs,max.; and −Vs,max, respectively) —marking the start of a "driver-enable" subinterval—each driver-branch input and output leg is initialized into a superconducting (junction-stack-transparent) state so that the output driver itself is rendered to state X. Thus, the TX+ and TX− outputs initially rise/fall to $+V_H$ and $-V_L$ levels, respectively, at the start of the driver-enable subinterval within each bit interval. As shown, a transmit data input pulse, if any, is applied to the input legs of the driver branches during the leading portion of the driver-enable subinterval (i.e., during another subinterval referred to herein as the single-flux-quantum (SFQ) interval). In this example, complement input data is supplied to both driver branches in which a logic '1' is indicated by lack of a quantum pulse during the SFQ interval and a logic '0' is indicated by presence of a quantum pulse, the former being shown for one bit interval and the latter shown for the subsequent bit interval. In the logic '1' bit interval, the blank SFQ interval (i.e., quantum pulse omission) renders no state change within the junction stacks of the output driver so that the state X output levels are maintained throughout the driver-enable interval. By contrast, in the logic '0' bit interval, quantum pulse 195 temporarily decreases the bias current flowing into the input leg of each driver branch (being supplied thereto in separate instances) and correspondingly increases the bias current within the output leg of each branch, causing at least one junction within the junction-stack of each output leg to transition to the voltage state and thereby increase the bias current flowing into the input leg. The increased current flow within each driver-branch input leg now exceeds the critical current of all junctions in the input-leg junction stack, rendering the entire stack into the voltage state and steering the bias current back to the output leg to likewise render the junction stack in that leg into the voltage state. As discussed above, the net effect of the input quantum pulse is a near-instantaneous transition of all junction stacks within the output driver to the voltage state, rendering the output driver into state Y in which the TX+ and TX− voltage levels are reversed relative to state X. That is, the junction stack resistances are chosen (i.e., engineered by virtue of the number of junctions (n) in each stack) to reverse the state-X output voltage levels—the junction stack resistance between the TX-output node and the negative supply raising the TX− voltage to $+V_H$ and the junction-stack resistance between the TX+ output node and positive supply node correspondingly lowering the TX+ voltage to $-V_L$ as shown. Accordingly, during the portion of the driver-enable sub-interval that follows the SFQ interval (a sub-interval shown in FIG. 2 as a transmit (tx) interval) either of two differential voltage states X or Y will be applied (driven onto) the chip-to-chip signaling link in accordance with the logic state conveyed in the transmit-data input. Those two differential signal states will yield a logic-level '1' or '0' signal sample when conditioned and captured within the signal receiver of the warm IC (i.e., when sampled within receive window 197 shown in FIG. 2).

Figure 3:
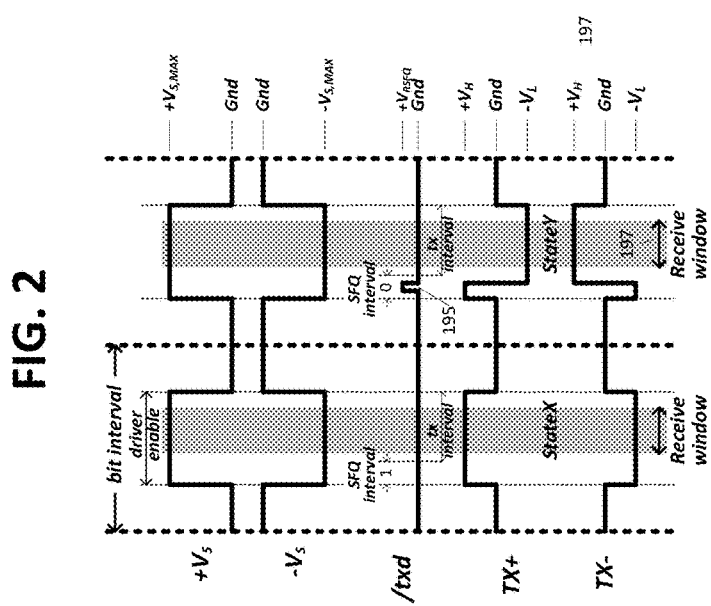
FIG. 3 illustrates static equivalent circuits for the X and Y states of the FIG. 1 output driver embodiment, showing the junction stacks as short-circuits in state X and as resistances in state Y.

FIG. 3 illustrates static equivalent circuits for the X and Y states of the FIG. 1 output driver embodiment, showing the junction stacks as short-circuits in state X (i.e., Vj=Rj=0) and as resistances n*Rj in state Y (i.e., where 'n' is the number of junctions per stack and Rj is the voltage-state resistance of each junction). More specifically, in state X, the TX+ output node is shorted to the supply-series resistance $R_s$ for the positive supply and separated from the counterpart negative-end supply-series resistance ($R_s$) by drive-point resistance $R_1$ so that the potential across the output leg falls entirely across R1 to yield a $+V_H$ output at TX+. The opposite is true with respect to the potential across the output leg of the TX− driver branch so that the TX− output is driven to $-V_L$. In state Y, the voltage-state junction stacks flips the voltage division within the output legs of the TX+ and TX− output drivers so that TX− is driven to $+V_H$ and TX+ is driven to $-V_L$.

Analysis of the state X and state Y output voltages generated by the TX+ and TX− driver branches in the output driver embodiments of FIGS. 1-3 demonstrates a nonuniform dependence on component values. More specifically, the top-to-bottom symmetry (and input/output leg asymmetry) of the TX− driver branch 141 (i.e., a respective junction stack and $R_1$ drive-point resistance) yields a slightly different pair of output voltages than those generated by TX+ driver branch 131—the latter being symmetric from input leg to output leg, but asymmetric with respect to $R_S$ connections. FIG. 4 presents the branch-to-branch output voltages in states X and Y (i.e., $V_{HX}$, $V_{LX}$, $V_{HY}$ and $V_{LY}$) of three alternative output driver implementations in terms of the bias current ($I_B$) flowing through respective input/output legs in each implementation and output state. Starting with the exemplary implementation 107 shown at left (the implementation also shown in FIGS. 1-3), it can be seen that the disparate axes of symmetry between the TX+ and TX-driver branches yields an imbalance (inequality) between state X output voltages $+V_{HX}$ and $-V_{LX}$ with $V_{LX}=|-V_{LX}|$ being slightly greater than $V_{HX}=|+V_{HX}|$, assuming that $R_O$ and $R_1$ component values are matched from branch to branch and, accordingly, that the state-X bias current, $I_{BX}$, is identical in each leg of each driver branch. The state Y output voltages $+V_{HY}$ and $-V_{LY}$ are similarly imbalanced, with $V_{HY}$ being slightly greater than $V_{LY}$. In both cases, the slightly greater magnitude of the TX− driver output may be negligible in view of the requisite receive-side differential voltage margin and/or compensated by disparate component values (e.g., divergent values of $R_1$ and/or other components and/or junction-stack sizes in the TX− and TX+ driver branches).

Still referring to FIG. 4, in the alternative differential output driver embodiments shown at 227 and 247, the TX+ and TX− driver branches share the same axis of symmetry-top-to-bottom in embodiment 227 or left-to-right in embodiment 247 so that all driver voltage amplitudes are nominally matched (i.e., so that the differential signal swing is symmetric with respect to ground or other center-point reference voltage). In those embodiments it may be necessary or desirable to supply alternate-polarity input pulses to the input legs of the driver branches to ensure entry into state Y. In the example at 227, for example +/txd may be supplied to TX− driver branch 241 (i.e., no pulse for logic '1', positive-going quantum pulse for logic '0'), while −/txd is supplied to TX+ driver branch 231 (no pulse for logic '1,' negative-going quantum pulse for logic '0'). Those inputs are reversed in the embodiment at 247, with +/txd supplied to TX+ driver branch 251 and −/txd supplied to TX− driver branch 261. In yet other embodiments uniform-polarity input pulses may he supplied to both driver branches in the embodiments at 227 and 247 and opposite-polarity input pulses may be supplied to the driver branches in embodiment 107 Also, the different axes of symmetry with respect to the TX+ and TX− driver branches (131, 141) in embodiment 107 may be swapped to yield a fourth output driver implementation (i.e., TX+ driver having top-to-bottom symmetry and TX− driver branch having left-to-right symmetry). In all cases, transmit data lines (i.e., conveying quantum txd pulses) may be capacitively or inductively coupled to the input legs of the two driver branches, and the driver outputs may be capacitively or inductively coupled to the chip-to-chip signaling link. Also, the supply voltages and supply-series resistances may be replaced in alternative embodiments by current sources (e.g., supplied by a current-mirror or other substantially constant current generating circuit disposed in the warm IC or elsewhere in the warmer temperature domain). Nonlinear elements may be used in place of the source-series resistances in yet other embodiments to reduce resistive power dissipation.

FIG. 5 illustrates additional considerations bearing on selection of component values and junction-stack sizes (i.e., number of junctions, 'n', per stack) in the context of the output driver embodiment 247 shown in FIG. 4. As can be seen, the input-side $R_O$ element counterbalances the $R_O$ signaling conductor impedance and thus balances the input and output driver legs within each driver branch. That is, the same bias current flows through the junction stack in each leg of each driver branch (i.e., $I_{BX}$ in state X, and $I_{BY}$ in state Y). As a general design goal is to ensure that each driver branch remains in state X in the absence of a quantum input pulse and reliably transitions to state Y in response to a quantum input pulse, components and supply voltage levels are selected to yield a bias current sufficiently below the critical current to avoid inadvertent X-to-Y state transition, but sufficiently close to the critical current to ensure intended X-to-Y state transition (i.e., $\alpha I_{Crit}$, where $\alpha$ is, for example, 0.9 or 0.95, though larger or smaller margins may be implemented). Exemplary bias current levels for states X and Y is illustrated in the timing diagram at 281 and 283, respectively, (a timing diagram that generally matches that shown in FIG. 2 except for depiction of an exemplary −/txd input pulse waveform and the bias current waveform). That is, the supply voltage levels (+Vs, −Vs) source-series resistances ($R_S$) and drive-point resistances (R1) are chosen, in accordance with the signaling link impedance ($2R_O$ or $R_O$ per conductor) to yield the desired state X bias current ($I_{BX}$) marginally below the critical current. By this arrangement, when quantum pulses are received at the driver branch inputs, the current within the output leg and then the input leg briefly increases to a level above $I_{Crit}$ to render the junction stacks in both legs of both driver circuits to the voltage state, thus dropping the bias current to $I_{BY}$ for the remainder of the driver-enable interval and flipping the output voltage polarity within each driver branch (i.e., from +$V_{HX}$ to −$V_{LY}$ in the TX+ driver branch and from −$V_{LX}$ to +$V_{HY}$ in the TX− driver branch) and correspondingly flipping the direction of the output current (i.e., $I_{OX}$=−$I_{OY}$). Component values may also be selected to ensure that $I_{BY}$ remains sufficiently above the hysteretic current ($I_{Hyst}$) to ensure that an output driver branch driven to state Y remains in that state until the driver-enable interval transpires.

Still referring to FIG. 5, the state X and Y signaling currents and thus the differential output voltage are constrained by the state X bias current ($I_{BX}$) which is itself constrained to be marginally below the critical current of the stacks of Josephson junctions. In a number of embodiments this output current limit (and corresponding signaling voltage limit) is raised by coupling multiple (two or more) output drivers in parallel to form a super driver. FIG. 6 illustrates a super driver embodiment in which the outputs of four component output drivers $307_1$-$307_4$ (generically, 307) are coupled in parallel to drive a differential signaling link. Note that any of the above-described output driver implementations may be used to implement component output drivers and that the resistive elements and/or junction-stack sizes within each component driver may be modified to accommodate the parallel driver arrangement. Additionally, one or more RSFQ splitter elements 351 may be provided to deliver the requisite number of transmit data signals to each driver. In the particular example shown, for instance, seven splitters 351 are provided to yield the eight /txd signals coupled in pairs to the four component drivers $307_1$-$307_4$ (more or fewer splitters 351 will be needed in implementations having more or fewer component drivers 307). Moreover, any one of the splitter elements 351 may include or be accompanied by a delay element that delays the respective /txd pulse by a predetermined delay interval, with that delayed /txd pulse driving a reverse-polarity transmitter output to implement a one-tap transmit filter. Where component drivers 307 receive alternate-polarity data inputs (e.g., as generally shown in embodiments 227 and 247 of FIG. 4), three splitters may be provided with respect to each data input polarity (and thus six splitters altogether) to render four instances of each data input to the appropriate input of a component driver. Also, because each component driver 307 perceives the signaling link impedance as 4*$R_o$ (or 4*Zo, where '*'denotes multiplication) by virtue of driver parallelism, the counterbalance impedance coupled to each data input may likewise be multiplied by the number of component drivers (i.e., to 4*$R_o$ as shown in detail view 310 in this case) to yield balanced current flow in the input and output legs of each driver branch.

FIG. 7 illustrates an alternative approach to raising the output signal swing, in this case providing multiple parallel input and output legs within each driver branch 370 (only one of which is shown) to create additional voltage swing with a fixed available current.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages.

Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific voltages, Josephson junction stack sizes or characteristic voltages/currents, signal path widths, signaling or operating frequencies, component circuits or devices and the like can be different from those described above in alternative embodiments. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A method of operation within an integrated-circuit (IC) component having a signal transmitter, the method comprising:
   receiving a transmitter power supply that cycles periodically between power-off and power-on voltage levels to define a sequence of enable intervals during which the signal transmitter is to output voltage levels corresponding to respective transmit data bits onto an external signaling link; and
   within the signal transmitter:
      generating, at the start of each output-enable interval, an initial nonzero voltage across conductors of the external signaling link, the initial nonzero voltage having a first polarity; and
      during each output-enable interval and after generating the initial nonzero voltage, conditionally transitioning the initial nonzero voltage to a second nonzero voltage according to whether the transmit data bit corresponding to the output-enable interval has a predetermined one of two binary states, the second nonzero voltage having a polarity opposite the first polarity.

2. The method of claim 1 wherein the initial nonzero voltage is representative of a first one of at least two digital states and the second nonzero voltage is representative of a second one of at least two digital states.

3. The method of claim 1 wherein receiving a transmitter power supply that cycles periodically between power-off and power-on voltage levels comprises receiving a first power supply voltage that cycles between a reference voltage and a first voltage level more positive than the reference voltage and receiving a second power supply voltage that cycles between the reference voltage and a second voltage level more negative than the reference voltage.

4. The method of claim 3 wherein each enable interval of the sequence of enable intervals is defined by an interval during which the first supply voltage is as the first voltage level and the second supply voltage is at the second voltage level.

5. The method of claim 1 wherein generating the initial nonzero voltage across conductors of the external signaling link comprises generating a first voltage level at an output node of a first driver-branch of the transmitter and generating a second voltage level at an output node of a second driver-branch of the transmitter, the first voltage level being more positive than the second voltage level.

6. The method of claim 5 wherein generating the first voltage level comprises generating a current that flows through a plurality of series-coupled Josephson junctions within the first driver-branch and that is the sum of currents flowing through a resistive element within the first-driver branch and through a node coupled to a first one of the conductors of the external signaling link.

7. The method of claim 6 wherein generating the second voltage level comprises generating a current that flows through a resistive element within the second driver-branch and that is the sum of currents flowing through a plurality of series-coupled Josephson junctions within the second driver-branch and a current flowing through a node coupled to a second one of the conductors of the external signaling link.

8. The method of claim 6 wherein each Josephson junction within the plurality of series-coupled Josephson junctions is characterized by a nominal critical current, above which the Josephson junction transitions from a superconducting state to a non-superconducting resistive state, and wherein generating the current that flows through the plurality of series-coupled Josephson junctions within the first driver-branch comprises generating a current flow below the nominal critical current.

9. The method of claim 8 wherein conditionally transitioning the initial nonzero voltage to a second nonzero voltage according to whether the transmit data bit has the predetermined one of two binary states comprises temporarily increasing the current flowing through the plurality of series-coupled Josephson junctions of the first driver-branch to a level above the nominal critical current to render each of the Josephson junctions into the non-superconducting resistive state.

10. The method of claim 9 wherein temporarily increasing the current flowing through the plurality of series-coupled Josephson junctions of the first driver-branch to a level above the nominal critical current to render each of the Josephson junctions into the non-superconducting resistive state comprises transitioning the first voltage level to a third voltage level that is more negative than the first voltage level.

11. An integrated-circuit signal transmitter comprising:
one or more inputs to receive a transmitter power supply that cycles periodically between power-off and power-on voltage levels to define a sequence of enable intervals during which the signal transmitter is to output voltage levels corresponding to respective transmit data bits onto an external signaling link; and
output circuitry to:
generate, at the start of each output-enable interval, an initial nonzero voltage across conductors of the external signaling link, the initial nonzero voltage having a first polarity; and
during each output-enable interval and after generating the initial nonzero voltage, conditionally transition the initial nonzero voltage to a second nonzero voltage according to whether the transmit data bit corresponding to the output-enable interval has a predetermined one of two binary states, the second nonzero voltage having a polarity opposite the first polarity.

12. The integrated-circuit signal transmitter of claim 11 wherein the first voltage is representative of a first one of at least two digital states and the second voltage is representative of a second one of at least two digital states.

13. The integrated-circuit signal transmitter of claim 11 wherein the one or more inputs to receive the transmitter power supply that cycles periodically between power-off and power-on voltage levels comprises:
a first supply input to receive a first power supply voltage that cycles between a reference voltage and a first voltage level more positive than the reference voltage; and
a second supply input to receive a second power supply voltage that cycles between the reference voltage and a second voltage level more negative than the reference voltage.

14. The integrated-circuit signal transmitter of claim 13 wherein each enable interval of the sequence of enable intervals is defined by an interval during which the first supply voltage is as the first voltage level and the second supply voltage is at the second voltage level.

15. The integrated-circuit signal transmitter of claim 11 wherein the output circuitry to generate the initial nonzero voltage across conductors of the external signaling link comprises a first driver-branch to generate a first voltage level at a first output node of the integrated-circuit signal transmitter, and a second driver-branch to generate a second voltage level at a second output node of the integrated-circuit signal transmitter, the first voltage level being more positive than the second voltage level, the first and second output nodes to be coupled respectively to a first one and a second one of the conductors of the external signaling link.

16. The integrated-circuit signal transmitter of claim 15 wherein the first driver-branch to generate a first voltage level comprises a first plurality of series-coupled Josephson junctions and a first resistive element configured to establish a current flow through the first plurality of series-coupled Josephson junctions that is the sum of currents flowing through the first resistive element and through the first output node.

17. The integrated-circuit signal transmitter of claim 16 wherein the second driver-branch to generate the second voltage level comprises a second plurality of series-coupled Josephson junctions and a second resistive element configured to establish a current flow through second resistive element that is the sum of currents flowing through the second plurality of series-coupled Josephson junctions and through the second output node.

18. The integrated-circuit signal transmitter of claim 16 wherein each Josephson junction within the first plurality of series-coupled Josephson junctions is characterized by a nominal critical current, above which the Josephson junction transitions from a superconducting state to a non-superconducting resistive state, and wherein the current that flows through the first plurality of series-coupled Josephson junctions within the first driver-branch is below the nominal critical current during generation of the initial nonzero voltage.

19. The integrated-circuit signal transmitter of claim 18 wherein the output circuitry to conditionally transition the initial nonzero voltage to a second nonzero voltage according to whether the transmit data bit has the predetermined one of two binary states comprises circuitry to temporarily increase the current flowing through the first plurality of series-coupled Josephson junctions to a level above the nominal critical current to render each Josephson junction of the first plurality of series-coupled Josephson junctions into the non-superconducting resistive state.

20. The integrated-circuit signal transmitter of claim 19 wherein the circuitry to temporarily increase the current flowing through the first plurality of series-coupled Josephson junctions to a level above the nominal critical current to render each Josephson junction of the first plurality of series-coupled Josephson junctions into the non-superconducting resistive state comprises circuitry to transition the first voltage level at the first output node to a third voltage level that is more negative than the first voltage level.

21. A signal transmitter comprising:
means for receiving a transmitter power supply that cycles periodically between power-off and power-on voltage levels to define a sequence of enable intervals during which the signal transmitter is to output voltage levels corresponding to respective transmit data bits onto an external signaling link; and
means for generating, at the start of each output-enable interval, an initial nonzero voltage across conductors of the external signaling link, the initial nonzero voltage having a first polarity; and
means for conditionally transitioning the initial nonzero voltage to a second nonzero voltage during each output-enable interval according to whether the transmit data bit corresponding to the output-enable interval has a predetermined one of two binary states, the second nonzero voltage having a polarity opposite the first polarity.

* * * * *